Feb. 8, 1966 HISAO MAEDA 3,234,480

SHIELDED SUPERWIDE-BAND HIGH-FREQUENCY TRANSISTOR AMPLIFIER

Filed Aug. 30, 1961 3 Sheets-Sheet 1

Hisao Maeda
Inventor

By Mestern, Ross & Mestern

Feb. 8, 1966 HISAO MAEDA 3,234,480

SHIELDED SUPERWIDE-BAND HIGH-FREQUENCY TRANSISTOR AMPLIFIER

Filed Aug. 30, 1961 3 Sheets-Sheet 2

United States Patent Office 3,234,480
Patented Feb. 8, 1966

3,234,480

SHIELDED SUPERWIDE-BAND HIGH-FREQUENCY TRANSISTOR AMPLIFIER

Hisao Maeda, 13 Shiba-ko, Minato-ku, Tokyo-to, Japan

Filed Aug. 30, 1961, Ser. No. 136,694
Claims priority, application Japan, Nov. 10, 1960, 35/44,330
2 Claims. (Cl. 330—21)

The present invention relates to a shielded, superwide-band high-frequency transistor amplifier wherein the primary resonant circuits of two sets of closely coupled resonant networks having different frequency bands are connected in series, an output resistance between the emitter and collector of a transistor is jointly bridged across the series connected network, a resistance providing an effect more than 10 times larger than that of said output resistance is connected as a load across each primary circuit, a suitable tap is provided for each secondary circuit, these taps being connected in series to be jointly bridged by the input resistance across the emitter and base of a succeeding transistor, and the loaded Q of all resonant circuits of these coupled circuits is less than 10.

It is the principal object of this invention to provide a two- or three-band, high-frequency transistor amplifier of the fixed-resonance type wherein the pass bands are less affected by a change in the output resistance caused by the AGC voltage which can be impressed across the transistor in the preceding stage.

Further objects and advantages of the present invention will become apparent, and this invention will be better understood, from the following description, reference being made to the accompanying drawing, in which the same or equivalent members are designated by the same reference numerals and in which.

Figure 1:
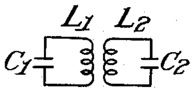
PRIOR ART Fig. 1
FIGS. 1 through 7 and 9 illustrate diagrams for explaining this invention.
Figure 2:
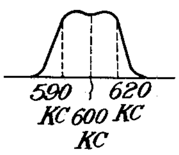
PRIOR ART Fig. 2
Figure 3:
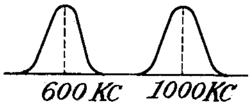
PRIOR ART Fig. 3

In the prior art it is well known that in order to obtain a broad pass band of 10 kc. to 20 kc. or more, as shown in FIG. 2, electromagnetically coupled circuits comprising two resonant networks $L_1C_1$ and $L_2C_2$ in FIG. 1 are utilized in the field of radio communication. However, in the general use of such systems, if one tries to design a superwide-band circuit having a pass band corresponding to two or three times its resonant frequency by adjusting the degree of coupling, the depression occurring at the central portion of the frequency-response characteristic will be greatly increased as shown in FIG. 3, which is a diagram corresponding to two resonant circuits having resonant frequencies which differ from each other by factors of two or three.

Figure 4:
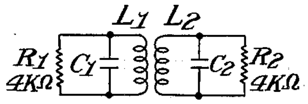
Figure 5:
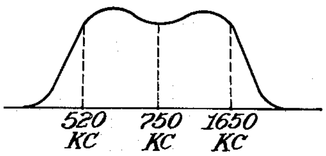
Figure 6:
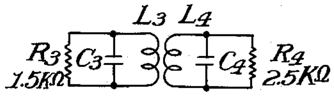
Figure 7:
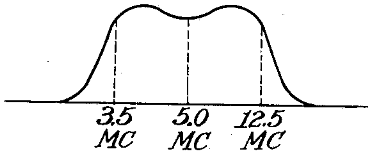
Figure 8:
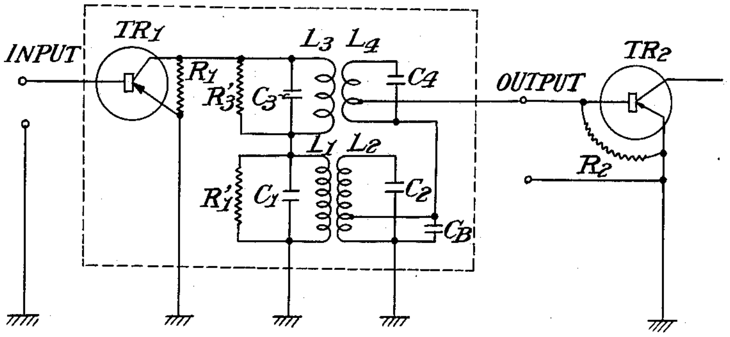
FIG. 8 and FIGS. 10 through 12 are circuit diagrams of different amplifier embodiments of this invention.

With such an arangement, it is obvious that it will be impossible to obtain uniform amplification throughout the pass band. Accordingly, in order to decrease the depth of the depression at the central portion, as shown in FIG. 3, so as to obtain a relatively flat superwide-band response covering a required pass band, e.g. from 520 kc. to 1650 kc., wherein the depression is limited to about 3 db, it is necessary to load the two resonant circuits with resistances $R_1$ and $R_2$, respectively, and to lower their respective Q to less than 10, as shown in FIG. 4, and further to couple these two resonant circuits very closely. This arrangement provides a response curve as shown in FIG. 5. The same characteristic can be obtained at the higher frequencies by employing smaller inductances and capacitances in the resonant circuits. Thus, as shown in FIG. 6, when two resonant circuits $L_3C_3$ and $L_4C_4$ are tuned to a frequency much higher than that of FIG. 4 and are closely coupled by loading them with resistances $R_3$ and $R_4$, respectively, and if the resultant Q is selected to be less than 10, a characteristic as shown in FIG. 7 will be obtained. When the loaded Q is decreased to such an extent as described above, the impedances of the coupled circuits will become extremely low so that hardly any amplification can be realized when it is used for a vacuum-tube amplifier. Surprisingly, however, since transistors have considerably higher mutual conductances and lower input and output impedances than vacuum tubes, they can operate as satisfactory loads even if the impedances of these coupled circuits are low. Moreover, it is possible to utilize the input impedance of the second transistor $TR_2$ in lieu of the damping resistances $R_2$ and $R_4$ in FIGS. 4 and 6 so that it is possible to decrease the undesirable losses and to obtain sufficient gain. This is shown in FIG. 8, wherein the primary resonant circuits of two pairs of closely coupled resonant circuits ($C_3$, $L_3$; $C_4$, $L_4$ and $C_1$, $L_1$; $C_2$, $L_2$) are connected in series and a preceding transistor $TR_1$, a succeeding transistor $TR_2$, input and output resistances $R_2$ and $R_1$ of the transistors, and individual damping resistances $R_1'$ and $R_3'$ are provided. Generally, the input impedance of a transistor is a small fraction of its output impedance. Therefore, in carrying out this invention, it is generally preferable to connect the full winding or an additional winding on the primary coil across the output side of the transistor and to connect an intermediate tap of the secondary winding across the input side of the transistor of the succeeding stage, as shown in FIG. 8. According to this invention, in order to lower the loaded Q of the respective primary circuits to less than 10, a resistance $R_1'$ or $R_3'$ of less than $1/10$ the output resistance of the transistor $TR_1$ is employed for the load. Accordingly, the damping of the coupling circuit is mainly dependent upon the load resistance $R_1'$ (FIG. 8). In spite of this lowered Q, sufficiently large gain can be achieved.

In a system according to this invention, changes in the output resistance $R_1$ of the transistor caused by the AGC voltage will not have any appreciable effect upon the damping of the primary circuit. Moreover, this invention is effective in preventing the changes in the pass band caused by normal variation in the commercially available transistors. An additional damping resistor may also be included in the secondary circuit, e.g. as shown at $R_B$ in FIG. 12.

Figure 9:
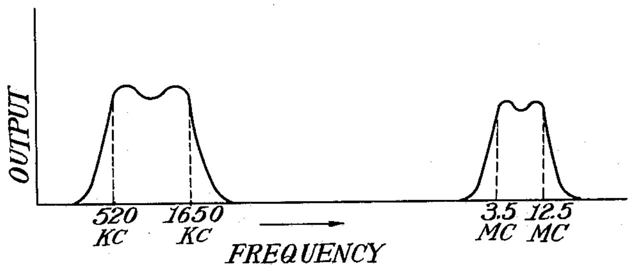
Figure 10:
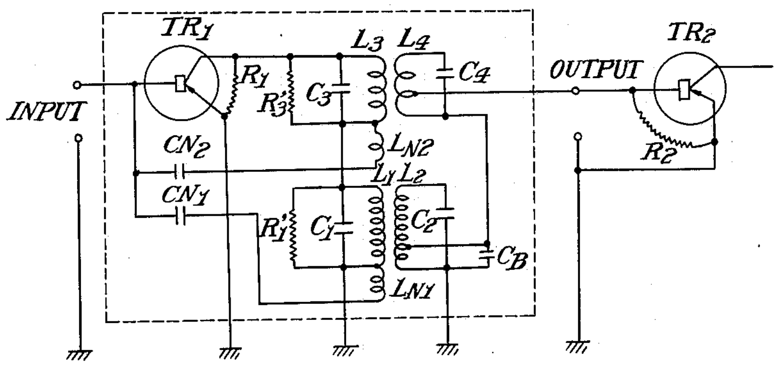
Figure 12:
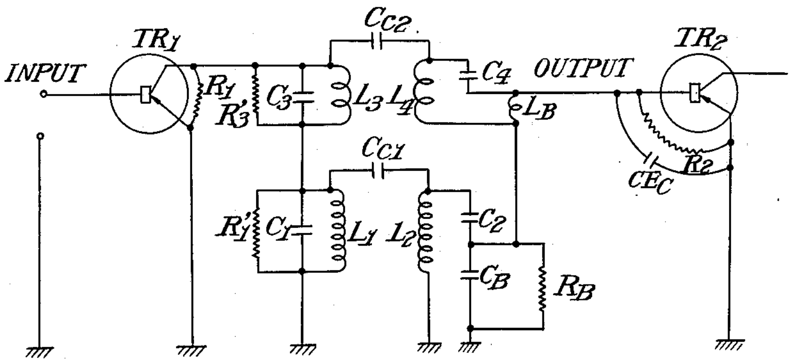

When the secondary taps are connected in series, it is possible to obtain better results when the secondary side having the lower resonant frequency is shunted by a capacitor $C_B$ (FIG. 8). This capacitor acts, in effect, as a coupling condenser between the secondary networks and is shunted by an additional impedance $L_2'$ represented by an extension of the induction branch $L_2$ of the circuit $L_2C_2$. In FIG. 12, described in greater detail hereinafter, the shunting impedance connected across coupling condenser $C_B$ is the resistor $R_B$. By utilizing the circuit shown in FIG. 8 embodying this invention, it is possible to provide an amplifier having two superwide pass bands as shown in FIG. 9. According to this invention, it is also possible to provide an amplifier having three superwide pass bands by connecting three sets of closely coupled resonant circuits in series. In order to stabilize the amplification, as shown in FIG. 10, auxiliary coils $L_{N1}$ and $L_{N2}$ may be provided for the respective primary circuits, or taps may be provided in coils $L_1$ and $L_3$ for connection to the neutralizing capacitors $C_{N1}$ and $C_{N2}$, respectively. In this case, since the capacitor $C_{N2}$ of the higher-frequency primary circuit acts to increase the base-collector capacitance of the transistor with respect to that of the lower-freqeuncy primary circuit, the capacitor $C_{N1}$ is required to have a correspondingly larger capacitance.

Figure 11:
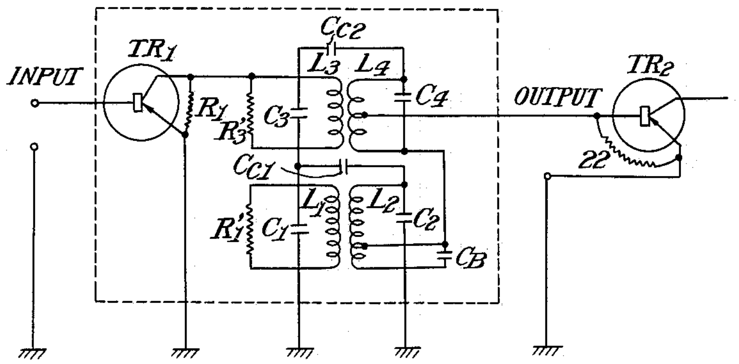

In carrying out this invention in practice, it is also possible to utilize a capacitive coupling circuit, as shown in FIG. 11. In this figure, $C_{C1}$ and $C_{C2}$ represent the coupling capacitors. In this embodiment, the damping resistors of the resonant circuits may be connected at any suitable position. Thus, by increasing the number of closely coupled circuits, a superwide-band, high-frequency amplifier covering two or three bands can be provided. Moreover, even when the AGC voltage is impressed, there will be no appreciable effect on the pass band characteristics. Furthermore, when the high-frequency and high-potential elements, such as the collector of the first transistor, resonant circuits, neutralizing capacitors and the like which are partitioned in the dotted rectangles of FIGS. 8, 10 and 11, are enclosed in a shield can, and if the transistor-base terminal and a ground terminal are the input terminals, and the low-voltage output terminal and ground are the output terminals, it will be possible to obtain a stable high-frequency amplifier without the accompanying possibility of oscillations. By combining the amplifier of this invention with a transistor converter, it is possible to improve the signal-to-noise ratio, because the input signal is supplied to the converter after having been amplified.

The tap on the secondary side of the coupled resonant circuits may be provided on the coil or on a capacitive divider, made up of capacitor $C_4$ and the effective capacitance $CB_C$ of the succeeding transistor, as shown in FIG. 12. In the latter case, it is necessary to use a resistor $R_B$ to provide a direct-current path to the base. Actually, as the input capacitance between the base and emitter of a transistor is quite large, this arrangement is practical. As shown in FIG. 12, it is preferable to connect a bypass coil designated $L_B$ with a capacitor-tap on the higher-frequency circuit, this bypass coil serving as a high impedance for the higher-frequency side. This is to prevent the voltage on the low-frequency side from being decreased by the action of the capacitor $C_4$ since the resonating capacitance is usually very much smaller than the input capacitance $CB_C$ of the transistor.

While certain particular examples of a shielded superwide-band, high-frequency amplifier have been disclosed for the purpose of illustration and description, it is to be understood that various changes can be made therein without departing from the spirit and scope of the invention, it being intended to cover in the appended claims all such modifications as fall within the true spirit and scope of the invention.

What I claim as new and desire to secure by Letters Patent of the United States is:

1. A superwide-band high-frequency transistor amplifier, comprising a first transistor for amplifying incoming signals, a second transistor for receiving the amplified signals from said first transistor, a plurality of pairs of closely coupled parallel-resonant primary and secondary networks each having an inductive branch and a capacitive branch, the inductive branches of paired networks being electromagnetically coupled, said pairs of networks being tuned to different resonant frequencies within a pass band to be transmitted, said primary networks being serially connected across the output of said first transistor, means including a coupling condenser interconnecting said secondary networks, additional impedance means shunting said condenser, means including the input resistance of said second transistor loading said secondary networks for reducing the Q's thereof to a value less than 10, resistance means including the output resistance of said first transistor loading said primary networks for reducing the Q's thereof to a value less than 10, and shield means enclosing said first transistor and said networks.

2. An amplifier as defined in claim 1 wherein said resistance means includes a resistor individually bridged across each primary network, said resistor having a magnitude equal to a fraction of the value of said output resistance.

References Cited by the Examiner

UNITED STATES PATENTS

| | | | |
|---|---|---|---|
| 2,164,745 | 7/1939 | Kentner | 330—167 X |
| 2,270,539 | 1/1942 | Malling | 330—167 X |
| 2,298,498 | 10/1942 | Moore et al. | 334—40 X |
| 2,480,205 | 8/1949 | Wallman | 330—167 X |
| 2,931,988 | 4/1960 | Bussard | 330—18 |
| 2,981,835 | 4/1961 | Webster et al. | 330—22 X |
| 3,100,282 | 8/1963 | Fletcher | 330—68 |

FOREIGN PATENTS

| | | |
|---|---|---|
| 1,053,588 | 3/1959 | Germany. |
| 1,069,701 | 11/1959 | Germany. |

ROY LAKE, *Primary Examiner.*

NATHAN KAUFMAN, JOHN KOMINSKI, *Examiners.*